United States Patent [19]
Torok et al.

[11] Patent Number: 6,031,273
[45] Date of Patent: Feb. 29, 2000

[54] ALL-METAL, GIANT MAGNETORESISTIVE, SOLID-STATE COMPONENT

[75] Inventors: E. James Torok, Minneapolis, Minn.; Richard Spitzer, Berkeley, Calif.

[73] Assignee: Integrated Magnetoelectronics, Berkeley, Calif.

[21] Appl. No.: 09/208,628

[22] Filed: Dec. 8, 1998

Related U.S. Application Data

[62] Division of application No. 08/846,410, Apr. 30, 1997
[60] Provisional application No. 60/016,704, May 2, 1996.

[51] Int. Cl.[7] .............................. G01R 33/02; H01L 43/00
[52] U.S. Cl. .................... 257/421; 324/252; 338/32 R; 257/426; 365/171
[58] Field of Search ..................... 324/252, 249; 338/32 R; 360/110, 111, 113; 365/171, 230.06, 158, 173, 97; 257/295, 421–427, 52, 359

[56] References Cited

U.S. PATENT DOCUMENTS

| | | | |
|---|---|---|---|
| 5,565,236 | 10/1996 | Gambino et al. | 427/130 |
| 5,585,986 | 12/1996 | Parkin | 360/113 |
| 5,587,943 | 12/1996 | Torok et al. | 365/158 |
| 5,640,754 | 6/1997 | Lazzari et al. | 29/603.14 |
| 5,650,889 | 7/1997 | Yamamoto et al. | 360/97.01 |
| 5,650,958 | 7/1997 | Gallagher et al. | 365/173 |
| 5,652,445 | 7/1997 | Johnson | 257/295 |
| 5,654,566 | 8/1997 | Johnson | 257/295 |

*Primary Examiner*—Jay Patidar
*Attorney, Agent, or Firm*—Beyer & Weaver, LLP

[57] ABSTRACT

A solid-state component is described which includes a network of thin-film elements. At least one thin-film element exhibits giant magnetoresistance. The network has a plurality of nodes, each of which represents a direct electrical connection between two of the thin-film elements. First and second ones of the plurality of nodes comprise power terminals. Third and fourth ones of the plurality of nodes comprise an output. A first conductor is inductively coupled to the at least one thin-film element for applying a first magnetic field thereto.

24 Claims, 13 Drawing Sheets

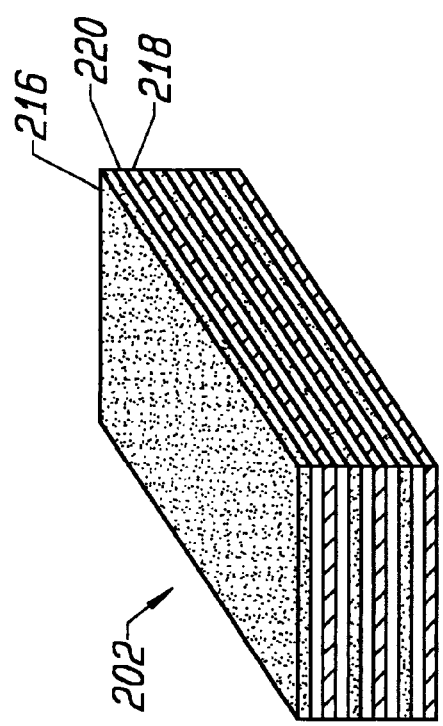
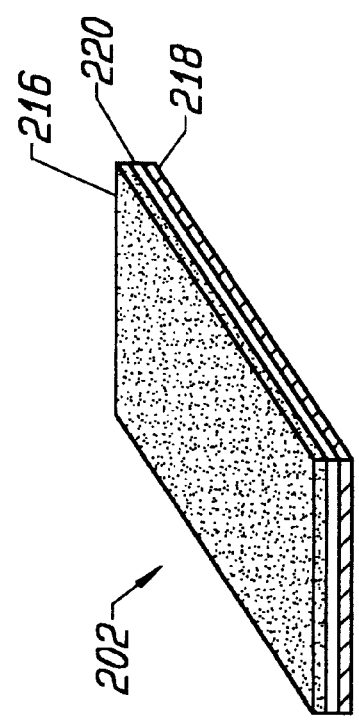

ALL-METAL, GIANT MAGNETORESISTIVE, SOLID-STATE COMPONENT

RELATED APPLICATION DATA

This application is a division of prior application Ser. No. 08/846,410 filed Apr. 30, 1997.

The present application is a non-provisional utility patent application based on Provisional Patent Application Ser. No. 60/016,704 filed on May 2, 1996, from which the present application claims priority.

BACKGROUND OF THE INVENTION

The present invention relates to a new type of all-metal solid-state component referred to herein as the GMR "transpinnor". More specifically, a multilayer metal structure is described herein which employs the phenomenon of giant magnetoresistance (GMR) to function as an active device with both transistor and transformer properties. In addition, a structure is described herein which functions as a passive transformer. It is well known that there is no transformer, either passive or active, in semiconductor bipolar technology. The active devices are superior to conventional thin-film transformers in two ways: (1) they have power gain, and (2) they have flat response down to and including dc. The duality of function of these active devices, as both transformer and transistor, renders them as a truly new type of basic electronic component, which we term a "transpinnor." In addition to their basic roles as switching devices (e.g., transistors) and transformers, transpinnors are well suited to provide the foundation of general-purpose all-metal electronics, both analog and digital. They provide functionalities corresponding to a variety of electronic and magnetic circuit components. These components include differential amplifiers, memory elements, and gated and pulse transformers. According to various embodiments, a GMR transpinnor with two input leads, two output leads and two power leads is described. Several methods of achieving anhysteretic (i.e., without hysteresis) films for linear transpinnor operation are also described.

The so called all-metal spin transistor was described in articles by Mark Johnson in Science (page 320, volume 260, Apr. 16, 1993) and IEEE Spectrum (page 47, May 1994), both of which are incorporated herein by reference. The device described is a bipolar transistor, in that it relies on two different carrier types. Whereas the carriers for silicon bipolar transistors are electrons and holes which have opposite electric charge, the two carrier populations for the all-metal spin transistor both comprise electrons which have opposite spin alignments. Generically, the Johnson all-metal spin transistor is a single-period, three-layer structure in which electric current is passed from layer to layer in the direction of the film normal. The Johnson transistor utilizes the fact that the lowest energy-conduction band in a ferromagnetic metal is for electrons with spin polarization in the direction of the magnetization, and the lowest energy state in a nonferromagnetic conductor is for equal populations of spin polarizations. The emitter and collector layers of the Johnson spin transistor are ferromagnetic films, and the base layer is a nonmagnetic metal. The output of the device is adjusted by changing the angle between the two magnetizations, i.e., by switching the magnetization direction of one of the two films so the relative orientations of the respective magnetization directions change between parallel and antiparallel alignments.

An all-metal spin transistor has several potential advantages for high-density applications. For example, because submicron lithographic techniques can readily be applied to its fabrication, it is expected that the all-metal spin transistor can be made qualitatively smaller than semiconductor bipolar transistors; possibly even 100 times as dense. Moreover, because an all-metal transistor is exclusively metal, it exhibits much greater carrier density than highly doped silicon. High carrier density will enable the spin transistor to operate with much smaller feature sizes than silicon transistors. In addition, the switching time of the spin transistor is projected at 2 ns or better.

Finally, because the spin transistor is an all-metal device, its fabrication will not require many of the high-temperature process steps inherent in the fabrication of silicon devices. This becomes even more significant when viewed in the context of a new all-metal GMR memory element described in commonly assigned U.S. Pat. No. 5,587,943 for NON-VOLATILE MAGNETORESISTIVE MEMORY WITH FULLY CLOSED-FLUX STRUCTURE issued on Dec. 24, 1996, the entire specification of which is incorporated herein by reference. According to specific embodiments of the invention described in that commonly assigned patent, the all-metal GMR memory element may be employed in a random access memory array, hereinafter referred to as a permanent random access memory (PRAM). Given that the memory elements of the PRAM are all-metal devices, it becomes apparent that it is at least theoretically possible to construct an all-metal random access memory using the all-metal spin transistor as the basic building block for the device's selection electronics (e.g., word and digit drivers, selection matrices, low-level sense gates, differential sense amplifiers, etc.). In fact, the referenced application briefly discusses this possibility. Not only would such a device have the speed and density advantages described above, it would entirely eliminate the need for any semiconductor processing steps in its fabrication.

However, despite the numerous potential advantages of the Johnson spin transistor, its implementation in various devices presents a practical problem because of the low operating range of the absolute value of its impedance. The difference in impedance between the "on" and "off" state of a Johnson spin transistor is only a few microohms. Moreover, the difference in output voltage between the maximum and minimum voltages is only a few microvolts (see Johnson, referenced above). These differences are too small to be useful in most applications. Indeed an "off" impedance of only a few microohms is a close approximation to a dead short.

From the foregoing it is apparent that an all-metal switching device with "on" and "off" resistances more closely matched to the characteristics of the GMR memory elements described in U.S. Pat. No. 5,587,943 is desirable.

SUMMARY OF THE INVENTION

The present invention provides an all-metal, solid-state component the operation of which is based on the phenomenon of giant magnetoresistance. The described structure, the "transpinnor", may be employed to emulate a wide variety of currently available electronic and magnetic components. For example, a specific embodiment of the present invention may be employed as a switching device to be used with GMR memory cells because the configuration of the multilayer structure described provides an "off" resistance which is high enough to provide proper isolation, and an "on" resistance appropriate for use with the GMR memory cells.

According to the invention, a solid-state device is described which includes a plurality of thin-film elements arranged in a network of electrical conductors.

At least one of the thin-film elements, and preferably more, exhibit GMR, and the network has means for power supply and for application of a magnetic field to one or more of the network elements so as to impress a specific direction of magnetization in at least one of the layers of the elements comprising GMR films and thereby cause a change of resistance in the layers. This solid-state device, the transpinnor, can then function in any of three ways: (1) in the dual capacity of an active transformer and a transistor, (2) as an active transformer alone, or (3) as a transistor alone.

Dual function as transformer/transistor: The transpinnor has characteristics similar to both transistors and transformers. Like a transistor, it can be used for amplification, logic, or switching. Like a transformer, it can be used to step voltages and currents up or down, and the input is resistively isolated from the output, i.e. the only connection between input and output is inductively through a magnetic field so there is no low-frequency resistive path between input and output. Unlike ordinary transformers, a transpinnor has no low-frequency cutoff; the coupling is flat down to and including dc. The gain is proportional to the supply voltage; doubling the supply voltage results in doubling both voltage output and current output.

Function as a transformer: The primary winding of the transformer corresponds to the input winding of the transpinnor. There is no resistive connection between this winding and the rest of the transpinnor. The input winding of the transpinnor may be just a single turn or many turns, depending on whether one intends to step up the voltage or the current. The secondary winding of the transformer corresponds to the output of the transpinnor. The amount of step-up is also adjustable by adjusting the voltage on the power leads of the transpinnor.

Function as a transistor: The input to the gate of the transistor corresponds to the input terminals of the transpinnor. The output terminals of the transistor correspond to the output terminals of the transpinnor. The transistor is used in logic applications, and/or in amplification. The transpinnor does both, and can be used in both applications. The amplification is proportional to the input voltage on the power leads. Use as logic gates can be achieved either with combinations of transpinnors each having only a single input line, or with single transpinnors having two or more input lines.

The nature of the invention is described with reference to a particular type of such a network, a Wheatstone bridge configuration. According to a specific embodiment in which the transpinnor emulates a switching device, at least one of the thin-film elements in the bridge exhibits GMR. According to a more specific embodiment, the bridge configuration includes one multilayer GMR element and three resistors. According to other embodiments, the bridge configuration includes several multilayer GMR elements (e.g., four in one embodiment). An additional conductor is coupled to and resistively isolated from the thin-film elements. The conductor is operable to apply a magnetic field to the thin-film GMR elements in response to an applied current in the conductor. The resistance of the thin-film GMR elements may be varied with the application of the magnetic field.

According to various specific embodiments, the multilayer GMR structures include a plurality of periods of layers. According to specific embodiments, each period of layers includes a first magnetic layer characterized by a first coercivity, a second magnetic layer characterized by a second coercivity, and a nonmagnetic conducting layer interposed between the first and second magnetic layers. Reference will be made in the following to permalloy for low-coercivity layers and to cobalt for high-coercivity layers. This is not intended to be restrictive. According to some embodiments, the topology of the bridge configuration provides a closed-flux structure. According to other embodiments the topology provides an open-flux structure.

Thus, according to the invention, a solid-state component is described which includes a network of thin-film elements. At least one thin-film element exhibits giant magnetoresistance. The network has a plurality of nodes, each of which represents a direct electrical connection between two of the thin-film elements. First and second ones of the plurality of nodes comprise power terminals. Third and fourth ones of the plurality of nodes comprise an output. A first conductor is inductively coupled to the at least one thin-film element for applying a first magnetic field thereto.

According to a specific embodiment of the invention, the solid-state component comprises a transpinnor which comprises a plurality of conducting elements interconnected in a network. Each of the conducting elements in the network, at least one of which exhibits GMR, is capable of supporting two or more external connections. In a more specific embodiment, all of the conducting elements exhibit GMR. The positive terminal of a power supply is applied at a node directly connecting two of the conducting elements. The negative terminal of the power supply is applied at a node directly connecting another pair of the conducting elements. The transpinnor output is provided between two terminals which comprise nodes directly connecting two other pairs of conducting elements and at which there are no power supply connections. An input line, one which is preferably not directly connected to any of the conducting elements in the network, applies a magnetic field to one or more of the conducting elements which exhibit GMR such that the resistance of these conducting elements tends to change. Thus, a current in the input line causes a change in the voltage across the output terminals.

A further understanding of the nature and advantages of the present invention may be realized by reference to the remaining portions of the specification and the drawings.

BRIEF DESCRIPTION OF THE DRAWINGS

FIG. 1b shows a typical resistance curve for a GMR film such as the one shown in FIG. 1a;

FIGS. 2c and 2d show two alternative structures for the multilayer GMR film of FIG. 2a;

FIG. 4 shows a transpinnor with a closed-flux configuration which is substantially the same schematically as the transpinnor of FIG. 3a;

FIG. 5 shows a transpinnor with an open-flux configuration which is substantially the same schematically as the transpinnor of FIG. 3a;

DESCRIPTION OF SPECIFIC EMBODIMENTS

Figure 1A:
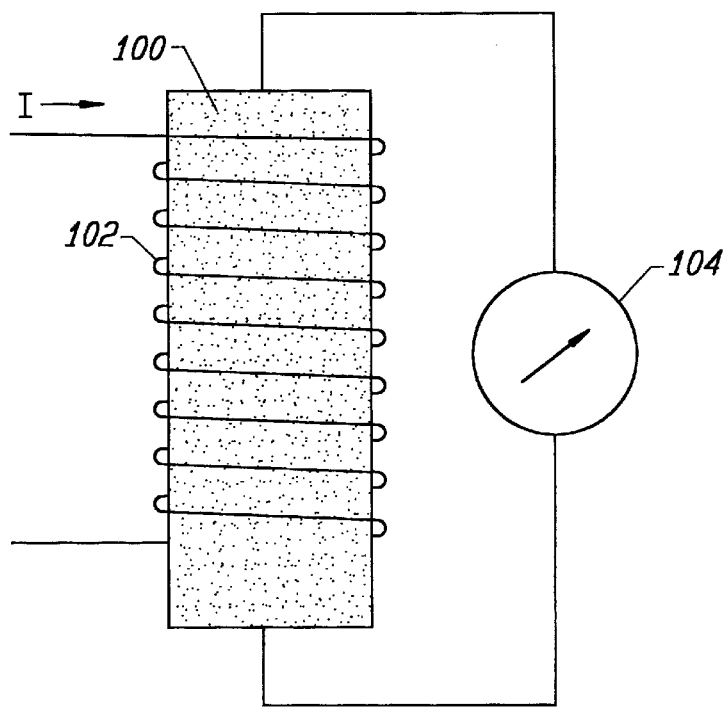
FIG. 1a shows a multilayer GMR film.

"Giant magnetoresistance" (GMR) refers to the difference in the resistance that conduction electrons experience in passage through magnetic multilayer films which is dependent on the relative orientation of the magnetization in successive magnetic layers. For ferromagnetic materials, this difference occurs because the energy level for conducting electrons in a ferromagnetic layer is lower (by a few electron microvolts) for electrons with spin parallel to the magnetization rather than antiparallel. A GMR film is a composite structure comprising one or more multilayer periods, each period having at least two magnetic thin-film layers separated by a nonmagnetic conducting layer. A large change in resistance can occur in a GMR structure when the magnetizations in neighboring magnetic layers change between parallel and antiparallel alignments.

According to a first embodiment of the invention, a GMR transpinnor is described which differs from the above-described Johnson spin transistor in a number of respects. In a specific embodiment, the GMR transpinnor of the present invention has six leads: two input leads, two output leads and two power leads. By contrast, the Johnson spin transistor has either 4 or 5 leads: two input leads, a base lead, and either one or two collector leads. The GMR transpinnor has current flowing in the film plane; the Johnson spin transistor has current flowing normal to the film plane. The GMR transpinnor changes resistance by making the barrier between layers reflect electrons; the Johnson spin transistor directly utilizes the energy level difference between spin parallel and spin antiparallel to the magnetization. Moreover, unlike either the Johnson spin transistor or a conventional silicon transistor, the output of the GMR transpinnor of the present invention is not only proportional to the input current, but also directly proportional to the current flowing through the power leads. As a consequence, the gain of the GMR transpinnor of the present invention can be adjusted to any desired level simply by adjusting the current from the power supply in the power leads. Thus, to double the output, one need simply double this current.

The gain of a GMR transpinnor designed according to the invention can be quite large, being limited only by the current-carrying capacity of the multilayer film. The power amplification is proportional to the square of the power-supply current, the square of the GMR, the square of the drive-line field efficiency, and inversely proportional to the square of the coercivity of the GMR film. Power amplification of several hundred per stage can be achieved. Specific embodiments of the GMR transpinnor of the present invention are better suited for pulse applications than for linear amplifiers because they exhibit magnetic hysteresis. That is, if such a transpinnor is turned on, it will remain on until a reverse pulse turns it off. This phenomenon is discussed in greater detail below.

One of the intriguing things about the GMR transpinnor of the present invention is that it can be used to implement the selection circuitry for a permanent random access memory (PRAM) which employs all-metal GMR memory elements. Thus, an all-metal GMR PRAM chip may be fabricated in which the deposition steps required for semiconductor elements need not be used. This greatly reduces the number of deposition and processing steps otherwise required to fabricate a GMR PRAM, thereby greatly reducing the cost of production.

Figure 1B:
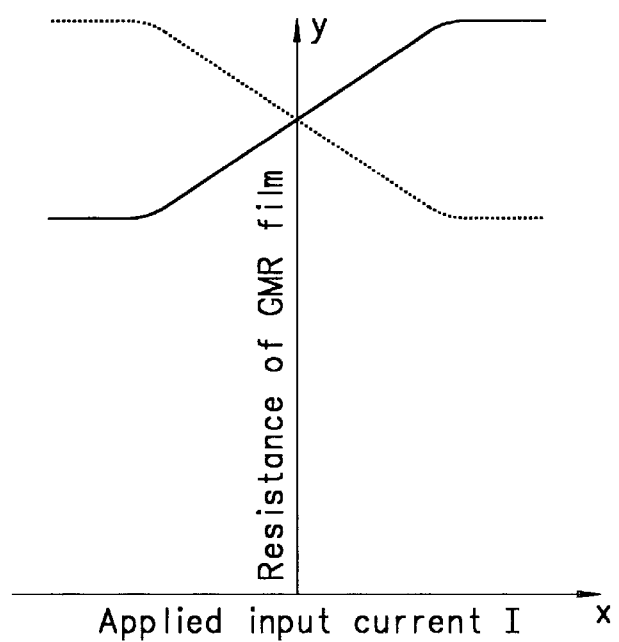

The property of giant magnetoresistance may be understood with reference to FIG. 1a which shows a multilayer GMR film 100 with a field coil 102 for supplying a magnetic field to GMR film 100. GMR film 100 contains magnetic layers of different coercivities separated by non-magnetic conducting layers (not shown). An ohmmeter 104 measures the resistance of GMR film 100 which changes as the input current I changes (see FIG. 1b); the dotted line represents the saturation of the high-coercivity film in the opposite direction to the solid line. As discussed above, if the magnetization direction of the magnetic layers of the first coercivity is parallel to the magnetization direction of the magnetic layers of the second coercivity, the resistance of the film is low. If the magnetization directions are antiparallel, the resistance is high. GMR film 100 may be formed of one or more periods, each period having a cobalt layer characterized by a moderate coercivity, a copper layer, a permalloy layer characterized by a lower coercivity than the cobalt layer, and another copper layer. The different coercivities of the alternating magnetic layers make it possible to achieve an antiparallel orientation of the respective magnetization directions. The copper layers physically separate the magnetic layers, which otherwise would be tightly coupled by exchange forces. Consequently, it is possible to switch the magnetization in the low coercivity film without switching the magnetization in the high coercivity film. FIG. 1b shows a hypothetical resistance curve for an input current I which is not sufficient to reverse the polarity of the higher coercivity cobalt layer. As the current is increased, more of the low coercivity film switches, thus increasing the resistance. When the entire low coercivity film is switched there is no further change in resistance and the resistance curve levels off.

Figure 2A:
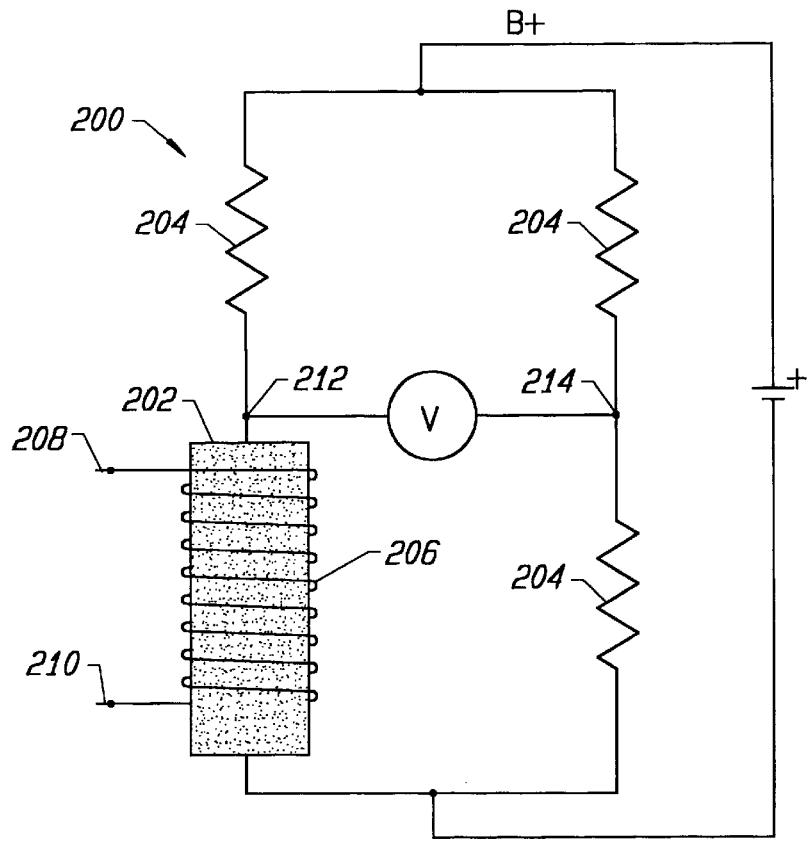
FIG. 2a is a schematic diagram of a transpinnor designed according to a first embodiment of the present invention.
Figure 2B:
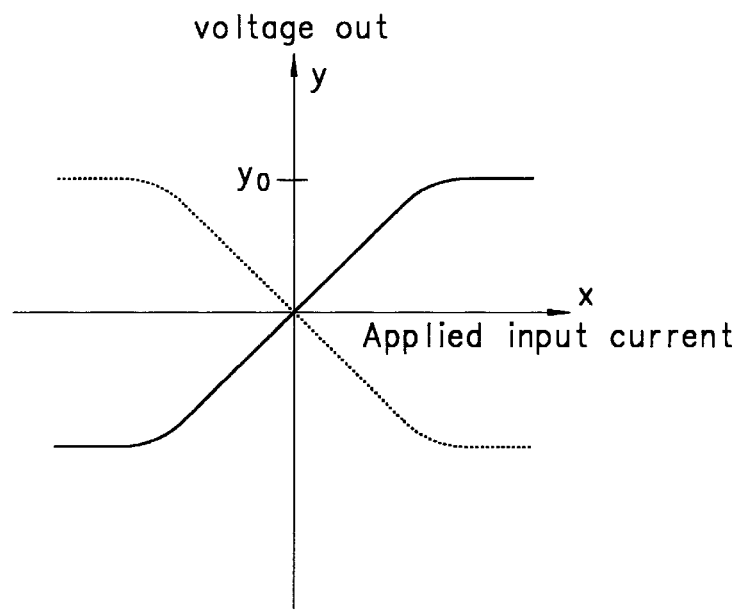
FIG. 2b shows a plot of the output voltage of the transpinnor of FIG. 2a as a function of input current.

FIG. 2a shows a schematic diagram of a transpinnor 200 designed according to a first embodiment of the present invention in which a GMR multilayer thin-film strip 202 is disposed in a bridge configuration with three resistive elements 204. A conductor 206 is wound around GMR film 202 for supplying a magnetic field thereto. An input signal is applied at terminals 208 and 210. Output terminals 212 and 214 give the output voltage, as indicated by a voltmeter. This configuration allows the output voltage to be zero as well as positive and negative. As is readily apparent, the input (between terminals 208 and 210) is completely isolated resistively from the output (between nodes 212 and 214) even for a DC input current I. The magnitude of the output is proportional to the applied B+ voltage and is limited only by the current carrying capacity of GMR film 202. FIG. 2b shows the output voltage of transpinnor 200 as a function of input current. If the values of resistors 204 are chosen correctly, the output voltage does not have a pedestal. That is, the curve crosses the y axis at y=0, and is not raised as in FIG. 1b. If the high coercivity film is reversed by either a strong input current or an external field, the polarity of the output is reversed, as shown by the dotted line in FIG. 2b. A single-period GMR film 202 and a three-period GMR film 202 are shown in FIGS. 2c and 2d, respectively, each having permalloy (216), cobalt (218) and copper (220) layers. The GMR films of FIGS. 2c and 2d illustrate that various embodiments of the present invention employ single period and multi-period structures. It will be understood that the GMR films employed by these various embodiments may have a wide variety of configurations and that the invention is not limited to the configurations shown in FIGS. 2c and 2d.

As mentioned, the output of transpinnor 200 changes as the resistance of GMR film 202 changes and is proportional to the voltage drop across GMR film 202 as the sense current passes through it. The output can be bipolar or unipolar, depending on the ratios of resistances chosen for the other legs (i.e., the bias can be positive, negative, or zero). Also, depending on the squareness of the B-H loop, the output can either be linear or a threshold step function. In addition, if the GMR film 202 is constructed symmetrically about the center, the net magnetic field from the sense current passing through the film will be zero. Therefore, the only limits on a magnitude of the sense current are the heating of GMR film 202 and/or electromigration. According to specific embodiments, the GMR films employ metals having high electromigration thresholds, such as copper, cobalt, nickel and iron.

Figure 3A:
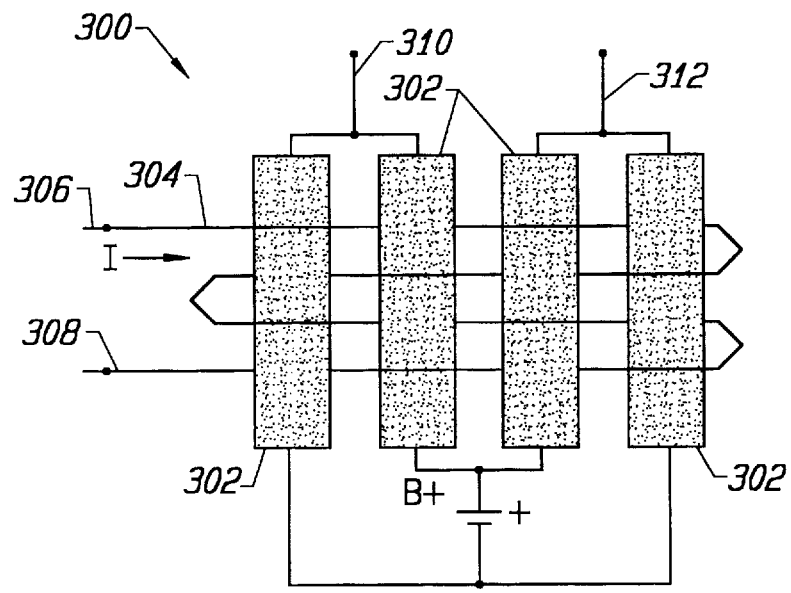
FIG. 3a is a schematic diagram of a transpinnor designed according to a second embodiment of the invention.
Figure 3B:
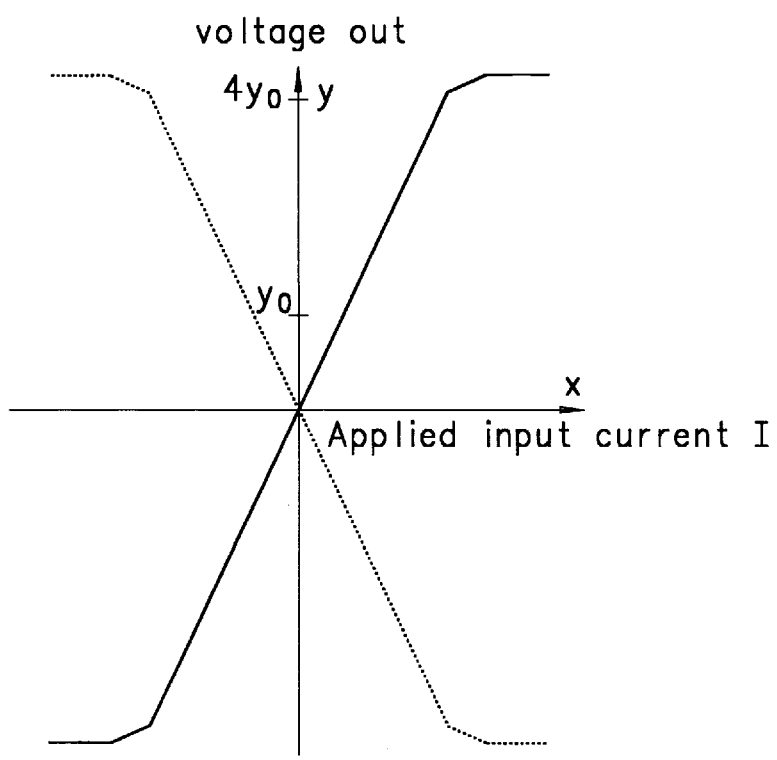
FIG. 3b shows a plot of the output voltage of the transpinnor of FIG. 3a as a function of input current.

FIG. 3a shows a schematic diagram of a transpinnor 300 designed according to a second embodiment of the invention. Instead of only one GMR film, this embodiment employs four GMR films 302 arranged in a bridge configuration with conductor 304 wound through them for supplying a magnetic field thereto. As with transpinnor 200, the input of the device (between terminals 306 and 308) is completely isolated resistively from the output (between nodes 310 and 312) even with a DC input current. Also, the output voltage of transpinnor 300 is determined by the magnitude of B+ and the current carrying capacity of GMR films 302. As shown in FIG. 3b, transpinnor 300 has four times the output of transpinnor 200. Transpinnor 300 also has the advantage that the bridge is balanced to zero offset if all four films are identical.

Figure 4:
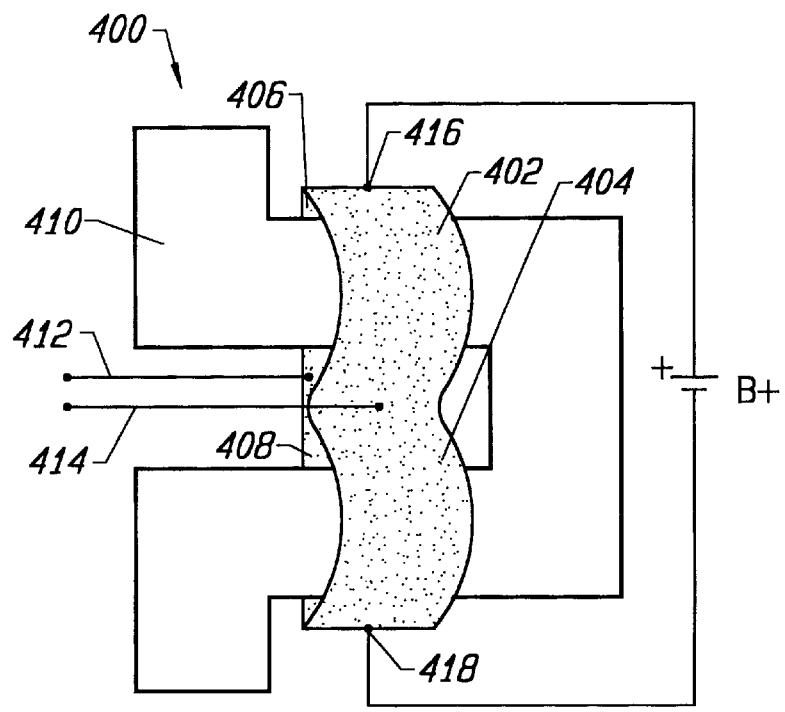

FIG. 4 shows a transpinnor 400 with a closed-flux geometry which is substantially the same schematically as transpinnor 300. There is insulation (not shown) in the middle of transpinnor 400 where top GMR films 402 and 404 nearly touch bottom GMR films 406 and 408. The four GMR films form a Wheatstone bridge in which the resistance of each is variable. Input conductor 410 supplies the magnetic field and the output voltage is provided by output conductors 412 and 414. A bias voltage B+ is applied between nodes 416 and 418.

Figure 5:
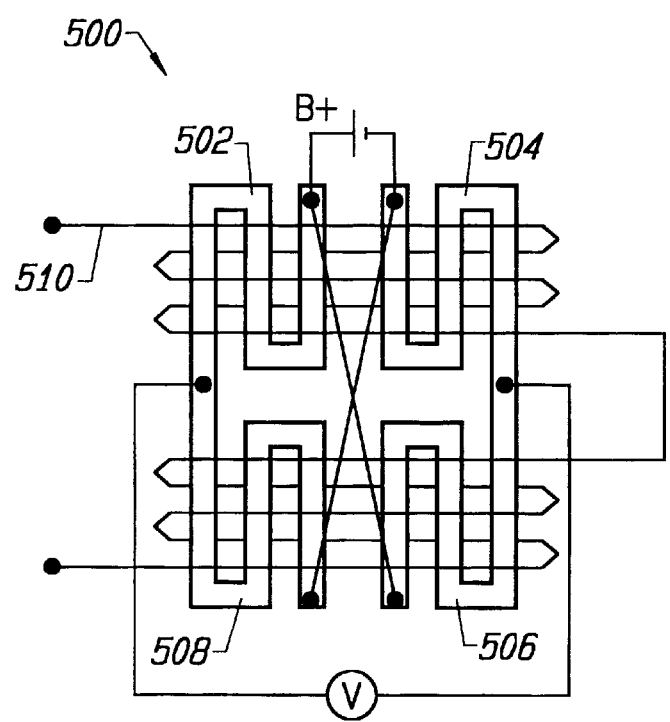

FIG. 5 shows a transpinnor 500 with an open-flux configuration which is substantially the same schematically as transpinnor 300. GMR film elements 502, 504, 506 and 508 form a Wheatstone bridge arrangement which requires only a single GMR deposition (i.e. the GMR layers are deposited in a single pump-down, with no patterning required between deposition of layers). Such a device was fabricated and tested experimentally. Input conductor 510 was wound as a single layer of magnet wire. The closed-flux structure of FIG. 4 gives superior performance, especially for small-size devices, but involves multiple GMR depositions and patterning.

Figure 6:
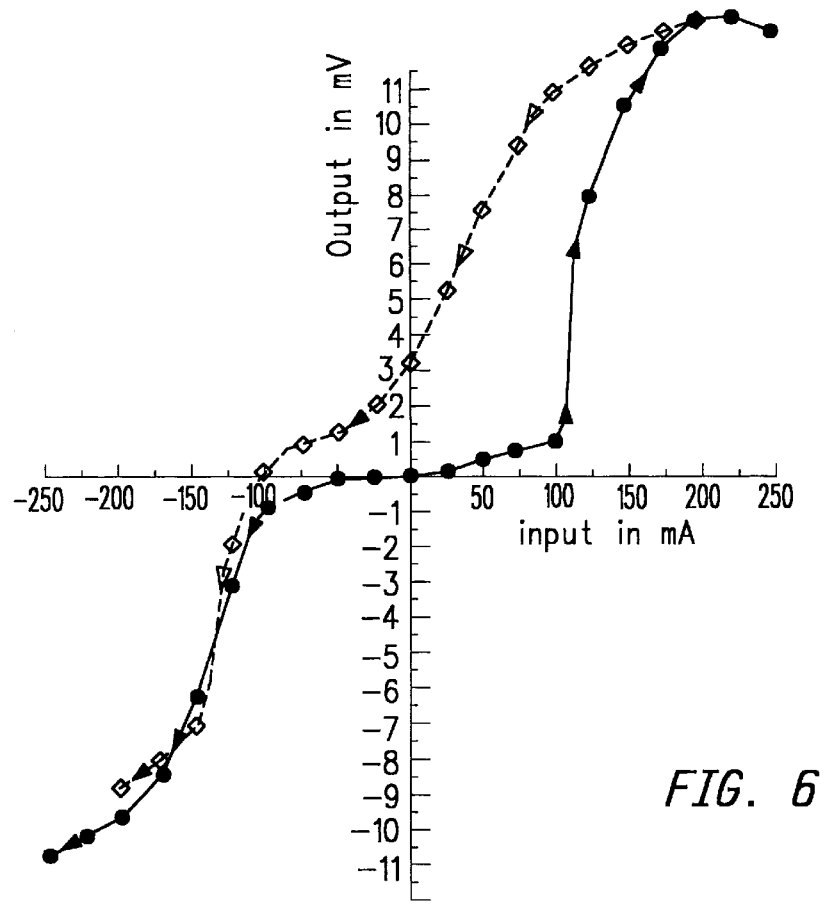
FIG. 6 illustrates the relationship between input current and output voltage for an all-metal GMR transpinnor designed according to a specific embodiment of the invention.

FIG. 6 illustrates the relationship between input current and output voltage for the all-metal GMR transpinnor shown in FIG. 5. The transpinnor was first initialized by saturating its four GMR film elements along the easy axes (i.e., parallel to the direction of film strips) with a magnet, and then applying input current until the magnetization direction of the permalloy layers in two of the elements switch completely (i.e., for maximum output from a Wheatstone bridge two resistors must be in the high resistance state and two in the low resistance state). After initialization in this manner, the data for the curve of FIG. 6 were taken. The solid curves, both positive and negative, were taken starting from the initialized state. The dashed curve is the remagnetization curve in which the applied field is made more negative (starting from the state of maximum output) in order to reestablish the initial magnetization state.

The solid curve of FIG. 6 shows a flat portion near the origin, then a rapid climb in output voltage when the input current reaches a threshold. It will be understood that this flat portion and threshold are desirable for digital applications, such as logic or selection matrices. The flat portion of the curve is largely due to the exchange bias between the permalloy and the cobalt layers. For linear applications, this portion of the curve can be removed either by the application of a small external bias, or by creating a symmetrical spin valve structure in which two cobalt layers are magnetized in opposite directions.

Figure 7:
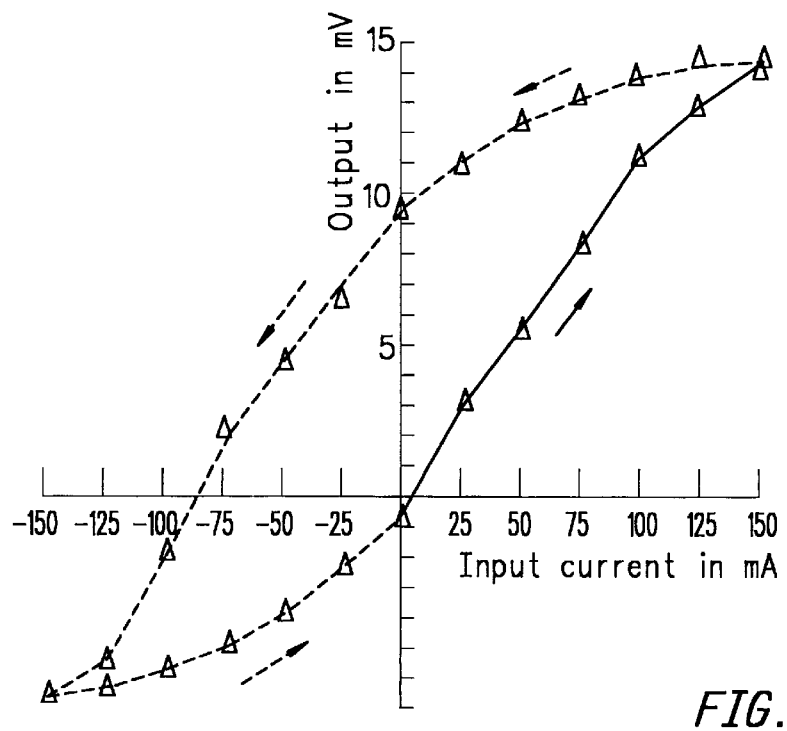
FIG. 7 shows output voltage vs. input current for the GMR transpinnor of FIG. 6 with a small external bias applied.

FIG. 7 shows an output voltage vs. input current curve for the GMR transpinnor of FIG. 6 but with a small external bias (e.g., 1.5 Oe) applied with a magnet in the easy direction (i.e., parallel to the film strips). As is evident, the exchange bias plateau around the origin has been essentially eliminated. As with FIG. 6, the solid lines begin with the initialized state, and the dashed line is the remagnetization curve. The finite hysteresis makes this transpinnor better suited for digital than for linear applications.

The GMR transpinnors of FIG. 6 has a rather large hysteresis in the permalloy of 1 Oe. However, permalloy coercivities of an order of magnitude smaller are found. This is of interest because the voltage and current gain of the GMR transpinnor of the present invention are inversely proportional to the permalloy coercivity, and the power gain is inversely proportional to the square of the permalloy coercivity. The permalloy coercivity found in multi-period GMR films is routinely much lower than single-period GMR films. The reason is that the domain walls form in pairs in the closely spaced films of the multi-period devices, greatly reducing the magnetostatic energy of the walls. This is beneficial for linear applications because it increases the gain of the transpinnor. Unfortunately, a corresponding reduction in the coercivity of the cobalt layers is also found. This reduction is undesirable because at some point the magnetization direction of the cobalt layers begin to switch at a lower threshold than the magnetization direction of some of the permalloy layers. Obviously, the proper balance between these two parameters must be found for the particular application.

It is desirable for specific embodiments of the GMR transpinnor of the present invention to have a gain greater than unity. The low-frequency gain of these GMR transpinnors is a function of their fundamental parameters. Referring again to FIG. 5, input line 510 of transpinnor 500 is completely isolated from the output circuit. For the purpose of calculating the gain of transpinnor 500, let the input current be i, the input voltage be v, and the resistance of the input line be r. Furthermore, let the output voltage of transpinnor 500 be V, the resistance of the output circuit (including the GMR film) be R, and the sense current be I. Let us also introduce a variable to express the ratio of the percentage change in resistance caused by a small applied magnetic field. Where the shear is unimportant compared to the coercivity, this quantity, which we call the resistibility, X, is given by $$X = GMR/(100 H_c) \quad (1)$$

where $H_c$ represents the coercivity of the permalloy in the GMR film. The voltage gain of the GMR transpinnor of the present invention is proportional to the resistibility, and the power gain is proportional to the square of the resistibility.

The input line of the transpinnor produces a field. The ratio of field to the current by which it is produced is referred to herein as the coil efficiency, E. Generally speaking, the value of E increases dramatically as the size of the transistor decreases. If other parameters (including the resistance of the input line) stay the same, the voltage amplification is proportional to E, and the power amplification is proportional to the square of E.

Given the definitions of the various parameters of the transpinnor, the voltage amplification is given by $$A_{voltage} = (R/r) \, I \, E \, X \quad (2)$$

and the power amplification is given by $$A_{power} = (R/r) \, I^2 \, E^2 \, X^2 \quad (3)$$

From (1) and (3) it becomes evident that the power amplification of transpinnor 500 is proportional to the square of the sense current, to the square of the GMR, to the square of the drive line efficiency, and inversely proportional to the square of the coercivity of the GMR film.

Some numerical examples of power amplification may be instructive. According to a first example, the input resistance is 0.8 Ohms, the resistance of the GMR film elements is 120 Ohms, the resistibility is 0.011/Oe, and the coil efficiency is 20 Oe/amp. If an input current of 500 mA is used, according to (3), the power amplification is 1.8. This is not a particularly good film.

According to a second example, the parameters are the same as for the first example above, except that the resistibility is 0.19/Oe. Now the power amplification is 541. This is higher than desirable for a logic tree, but may be reduced to a desirable value by appropriately decreasing the sense current.

According to a third example, a miniaturized transistor is configured as shown in FIG. 4, with the width of its features being on the order of one micron. The copper input conductor is 1 micron thick and 3 microns long. The input resistance is 0.05 ohms, the output resistance is 8 ohms, the coil efficiency is 6000 Oe/amp, the resistibility is 0.19/Oe, and the sense current is 1 mA. The power amplification is then 208.

The conclusion is that substantial power amplification can be achieved with GMR transpinnors of the present invention using existing GMR film configurations. Additionally, amplification factors in the hundreds can be obtained regardless of whether the transistors are large or so small as to be at the limits of conventional lithography because the power amplification factor is independent of the size of the device. However, although the GMR transpinnors of the present invention scale so their power amplification doesn't degrade when the devices are miniaturized, the power handling capability of the devices diminishes, of course, as the device size diminishes. The GMR transpinnors of the present invention can be designed to give either high output current and low output voltage, or high output voltage and low output current. These parameters are determined by the aspect ratio of the GMR film. If the GMR film is a long narrow conductor, the output is high voltage and low current. If the GMR film is a short wide conductor, the output is low voltage and high current. The power amplification is relatively independent of the aspect ratio.

To get high power amplification, the following should be done:

(1) Make the input stripline as thick as possible in order to lower the resistance r. The power amplification depends only linearly on r, so this is less critical than the other steps.

(2) Make the resistibility as high as possible, either by raising the GMR or by lowering the coercivity of the permalloy.

(3) Make the GMR films as thick as possible to allow higher sense current without electromigration problems. This means many periods (e.g., 15 periods has been employed to obtain GMR of 15%).

Although low GMR films with very low coercivity can be used to construct GMR transpinnors with high power amplification, the resulting device may be inefficient. If overall power consumption is a consideration, one should use high GMR films. It is possible, for example, to make GMR films with GMR of more than 22%.

There are a wide range of applications for which the transpinnor of the present invention represents a significant advance. For example, such transpinnors may be employed to implement nonvolatile logic gates, i.e., gates which maintain their states when power is removed. Additionally, because all-metal films exhibit much greater resistance to damage by radiation than semiconductors, the transpinnor of the present invention may be employed to implement intrinsically radiation-hard electronics.

The curve shown in FIG. 7 exhibits hysteresis. Although this is not harmful (and may indeed be useful) for logic devices, for linear transpinnor performance, the hysteresis loop needs to be closed and straightened in a finite operating region; additionally, films with very low-coercivity should be used. In general, the shape of the hysteresis loop of thin films depends on the direction of the applied fields. Different approaches to achieve anhysteretic GMR films for transpinnor operation in the linear region, based on three methods of eliminating hysteresis and distortion from GMR films, are described. One approach is the application of a transverse (i.e., perpendicular to the easy direction) bias field having a magnitude slightly larger than the anisotropy field of the low coercivity element; the signal to be amplified is applied as a varying easy-axis magnetic field. This bias field can be supplied by an external coil or magnet, by individually deposited magnets on each amplifier, or by a current in a stripline. The effect of the bias is to eliminate the hysteresis and to greatly increase the longitudinal permeability, as described in two publications, *Longitudinal Permeability in Thin Permalloy Films*, E. J. Torok and R. A. White, Journal of Applied Physics, 34, No. 4, (Part 2) pp. 1064–1066, April 1963, and *Measurement of the Easy-Axis and $H_k$ Probability Density Functions for Thin Ferromagnetic Films Using the Longitudinal Permeability Hysteresis Loop*, E. J. Torok et al., Journal of Applied Physics, 33, No. 10, pp. 3037–3041, October, 1962. The mathematics in these publications can be used to show that when a GMR film of resistance R, having one or more low coercivity layers (e.g. permalloy) with anisotropy field $H_k$, is biased with a hard axis field $H_t > H_k$, and to which a small easy axis field $dH_L$ is applied, the film will have a corresponding resistance change, dR, given by $$dR/dH_L = (GMR)R/(H_T - H_k) \quad (4)$$

where GMR is the maximum resistance change, and $H_T$ must be larger than the maximum $H_k$ of any region of the film. This differential resistance change can be quite large if the inhomogeneity of the film is small, and the corresponding amplification can be large. This is a sensitive method of achieving anhysteretic GMR films by a transverse-biased permeability. It results in an analog signal with a linear response within a certain range.

In another approach to eliminating the hysteresis, the permalloy layer in the transpinnor is driven and sensed in the hard direction. The cobalt layer is deposited so that its easy axis is parallel to the hard axis of the permalloy. This is accomplished by saturating the cobalt layer during its deposition at 90 degrees from the easy axis of the permalloy. This method does not generally require a bias field during operation; the exchange bias between the high coercivity layer(s) and the permalloy layer is normally sufficient to prevent the hard-axis loop from opening. The sensitivity of the hard-axis-driven film is not as good as in the approach based on the transverse-biased permeability, as described above, but the linearity extends over a broader range and this method is easier to implement in that it avoids biasing in the hard direction and driving in the easy direction.

Yet another approach involves a sampling method. A pulse is applied to the transpinnor between each data sample. The pulse is of sufficient amplitude to saturate the permalloy layers in the transpinnor to an initial state that is the same regardless of whatever signal was applied in between. The frequency of the applied pulse should be higher than the highest frequency of interest in the signal to be amplified. The result of using narrow pulses to reinitialize the magnetic material before each data sample is to erase the magnetic history and to eliminate the hysteresis in the output. The output can be sensed either with sampling techniques or as an analog output with a low-pass filter.

According to a specific embodiment of the invention, the all-metal GMR transpinnor is employed to implement selection matrices for a PRAM, the PRAM being described in the above-referenced copending U.S. patent application. Several advantages derive from the fact that the transpinnor and the PRAM cell are both GMR film devices. Because the transpinnors and the PRAM cells can be fabricated with the same deposition and masking steps, fewer process steps are required than for metal/semiconductor hybrid devices which must employ costly additional semiconductor depositions. Additionally, because the number of process steps is reduced, the device yields will be higher, providing additional cost savings.

Because both devices are all-metal, the transpinnors may be interspersed among the memory cells, allowing shorter lines with fewer bits per line. Moreover, like the PRAM cell, the performance of the all-metal transpinnor improves as its dimensions decrease. Therefore, the density of an all-metal GMR PRAM array based on the transpinnors of the present invention, unlike that of silicon-based devices, is limited only by the state of the art of lithography. Finally, the transpinnors of the present invention allow for the salvaging of chips with manufacturing defects because appropriate routing may avoid the affected areas of the chip. This is because the nonvolatile nature of the transpinnors means that the defective gates may effectively be ignored. Thus, according to a specific embodiment of the invention, the incorporation of the all-metal GMR transpinnor into a GMR PRAM provides a very high-density, high-speed, nonvolatile memory which is characterized by a relatively high manufacturing yield.

It is generally understood that all possible electronic circuits, analog and digital, can be implemented using active components, e.g., transistors, in combination with four basic passive components, i.e., resistors, capacitors, inductors and transformers. It is also well known that neither inductors nor transformers are available in semiconductor bipolar technology. By contrast, the GMR transpinnors of the present invention can be employed to provide both of these components. In fact, they are well suited to provide the basis of a variety of analog, digital and mixed general-purpose all-metal circuits, subsystems and systems. Since capacitance and resistance can be implemented with the same metal technology as that used for the passive transformer and the transpinnor, all these components can be combined very effectively on the same substrate to produce a comprehensive variety of all-metal circuits. Unlike semiconductor chips, whose performance suffers below a critical size, the characteristics of GMR devices improve as the dimensions are decreased.

Figure 8:
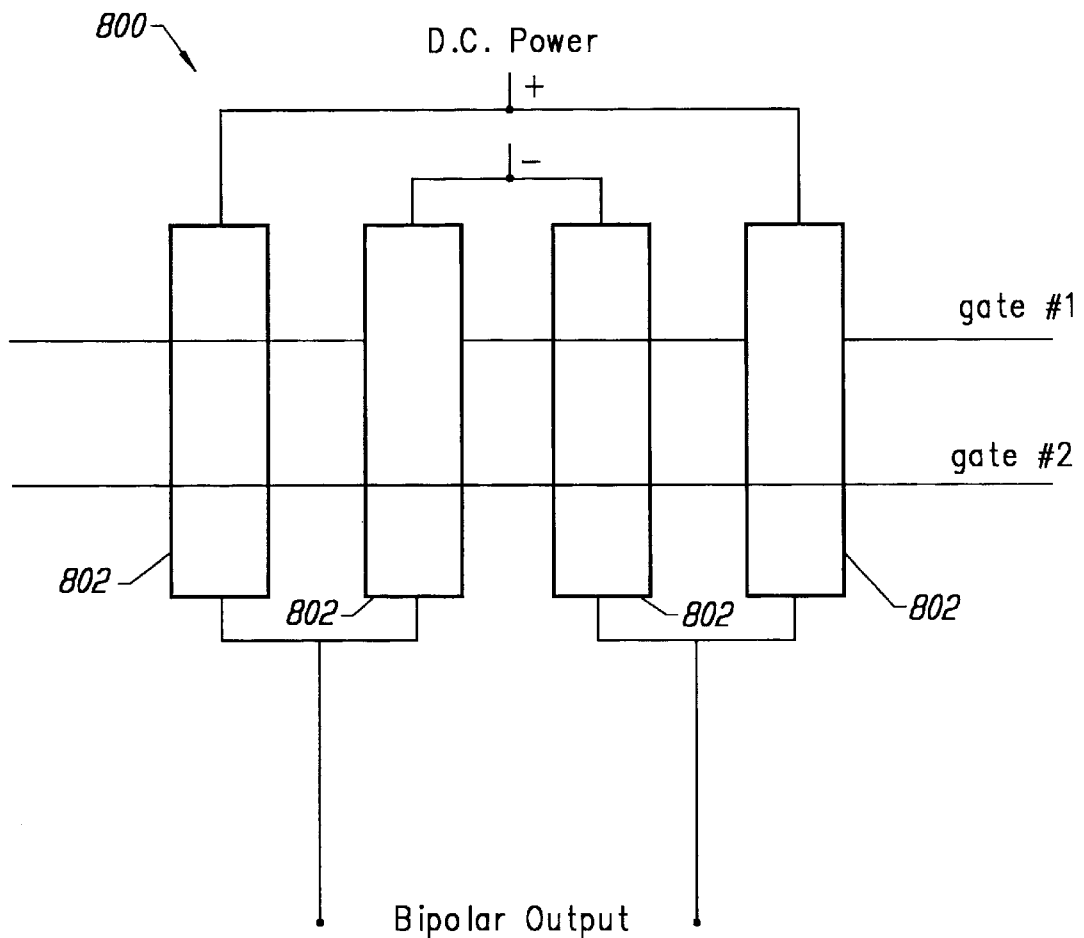
FIG. 8 shows an all-metal transpinnor for implementation of word and digit selection matrices for an all-metal GMR PRAM.
Figure 10:
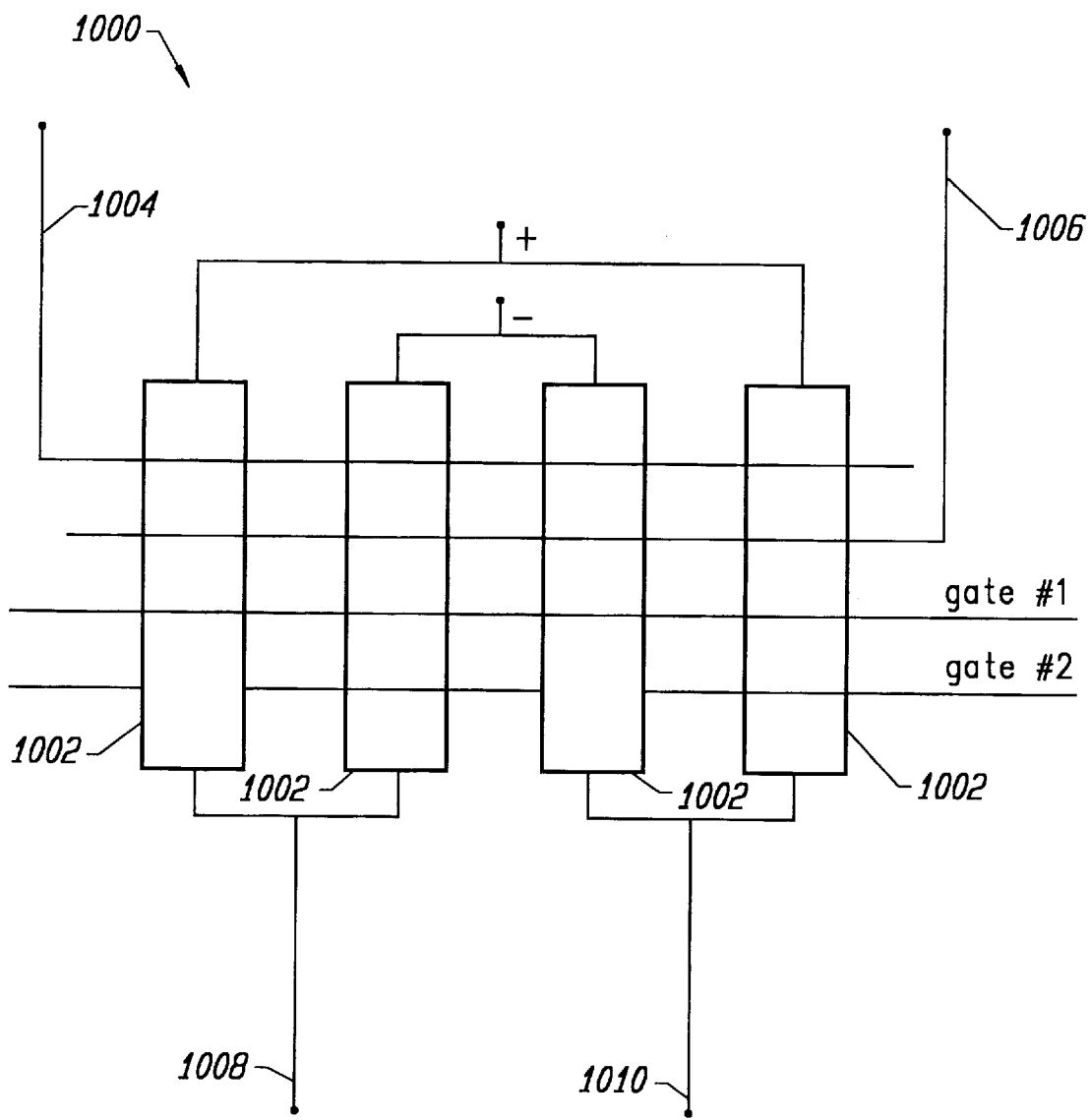
FIG. 10 shows a gated GMR differential amplifier designed according to one embodiment of the invention.

Biased in the appropriate operating region, GMR transpinnors can be used as basic building blocks of logic gates, thereby providing the foundation for GMR-based digital electronics. While logic elements can be made with combinations of transpinnors, just as with transistors, there is another alternative. Various logic operations can be implemented with a single transpinnor. These transpinnors have more than one input line. Examples of such transpinnors are shown in FIGS. 8 and 10.

Two procedures are useful in implementing logic gates with a single transpinnor. One involves setting the transpinnor threshold which is determined by the coercivity of the low-coercivity layers in the GMR film. Various ways of establishing the coercivity of a thin film are known in the art. Thus, the threshold is set by choosing or adjusting the coercivity of at least one of the low-coercivity layers in the GMR films of the transpinnor. The other procedure involves switching the polarity of the GMR films which is determined by the magnetization orientation of all the film layers. The polarity of the transpinnor is thus switched by reversing the direction of magnetization of all layers of all GMR films in the transpinnor.

Logic operations which can be implemented with a single transpinnor include the following:

AND gate: A transpinnor will not switch unless the sum of fields from the input lines exceeds the switching threshold. An AND gate is defined as one that yields no output unless all of its inputs are logical "1"'s. If the transpinnor has n input lines, and the amplitude of each input pulse is $(1/n)^{th}$ of the threshold, then the transpinnor is an AND gate.

NAND gate: This is the inverse of the AND gate and gives an output if and only if all inputs are zero. A transpinnor NAND gate is made similarly as the AND gate, by reversing the magnetization of all elements so that the gate will just switch if all n inputs are logical "0"s and not switch if one or more are a logical "1".

OR gate: The definition of an OR gate is one that gives an output if one or both inputs are a "1". This can be made by setting the threshold of a transpinnor such that a single input is sufficient to switch the film.

A practical problem is presented by the fact that different switching thresholds are required for different single transpinnor logic gates. There are, however, a variety of ways in which these thresholds may be adjusted for different types of gates on the same substrate. These include manipulation of the order of deposition because the order strongly influences the coercivity of both the low and high coercivity films. This method involves additional deposition steps. Another method of adjusting the switching threshold for a particular transpinnor is derived from the fact that the magnetic field from a current carrying stripline depends on the width of the strip line.

NOR gate: The definition of a NOR gate is one that gives an output if one or both inputs are a "0". This is merely the inverse of an OR. This can be done by reversing the polarity of the GMR films as in the above case of a NAND.

NOT gate: A NOT gate is an inverter that changes the polarity of an input pulse from positive to negative and vice versa. This is easily done with a transpinnor by reversing the polarity of the input winding, or by interchanging the power terminals.

Exclusive OR gate: This is a gate that gives an output if one and only one of the inputs is a "1". This can be done with a transpinnor such that one input is sufficient to switch the low-coercivity element, yielding an output, while two or more pulse inputs yield a field large enough to switch the high-coercivity element as well, yielding zero output. The gate must be reset after each use.

For logic and computer applications, transpinnors with sharp thresholds and square-pulse outputs are desirable. For analog applications, a linear response is better. Several methods of achieving linear transpinnor operation were already discussed above. Transpinnors operating in the linear region can be used to develop a full complement of basic analog circuits, sufficient to create general-purpose analog circuitry based on GMR films.

A specific example of a transpinnor operating in the linear region for application to signal amplification illustrates some of the unique advantages of the dual functionality of the transpinnor over silicon technology. Differential amplifiers are typically used to eliminate common-mode signal and common-mode noise within the frequency range of their operation. As discussed above, the range of operation of the transpinnor in its transformer function extends from (and including) dc to the high-frequency cutoff limit. The GMR transpinnor can advantageously be utilized in its transformer function to remove common-mode signal in the differential-input mode, as well as in its transistor function to amplify a low signal in the single-ended output mode. IN low-signal amplification, GMR transpinnors have the additional advantage of eliminating the problem of offset voltage at the input that is so troublesome in silicon integrated circuits. It should be noted that a high premium is paid in silicon technology to achieve low-offset input voltage for integrated differential amplifiers. That is, low-offset input voltage is achieved in silicon circuits only at the expense of degrading other parameters. No such price is associated with the use of transpinnors because of their dual transformer/transistor properties. Specifically, the input signal is applied to a differential input having the properties of a transformer primary with an additional advantage of flat low-frequency response inclusive to dc. The output signal is amplified by an output having transistor properties. Transpinnors are thus especially well suited as differential amplifiers.

Specific embodiments of the invention will now be discussed which may be employed to implement various portions of the selection electronics for an all-metal PRAM. As discussed above, because one can fabricate the transpinnors described herein entirely out of GMR films and metal conductors, such transpinnors can be used to implement the selection electronics (i.e., word and digit drivers, selection matrices, low-level sense gates, differential sense amplifiers, etc.) on a GMR PRAM chip. Conventional silicon-based devices need not be used at all.

According to a specific embodiment of the invention, an array of all-metal transpinnors are employed to implement word and digit selection matrices for an all-metal GMR PRAM. FIG. 8 shows one such all-metal GMR transpinnor 800 and two drive lines. Four GMR films 802 are tied together in a folded Wheatstone bridge configuration. Each GMR film 802 is shown as a rectangular strip with its easy axis oriented in the long direction. Flux closure is also along the easy axis, but is not shown. The two drive lines (gates #1 and #2) are deposited conductor strips. The application of current on gate #2 tends to magnetize all four GMR films in the same direction. The application of current on gate #1 tends to magnetize adjacent GMR films oppositely. With the proper pulse combinations one can use half-select pulses to magnetize the high-coercivity layers positively or negatively in one direction, or to magnetize alternate strips in alternate directions.

Using the gate lines it is possible to write a magnetic configuration into a single transpinnor that is different from the magnetic configuration in all other transpinnors in the selection matrix. When a half-select pulse is transmitted down a gate line that traverses a row of such transpinnors, only the one with the different magnetic configuration will emit a pulse. For example, if all four films in all the transpinnors of the selection matrix are written uniformly in the same direction, then a half-select pulse on the gate #2 line would not generate an output in any of the devices. However, if one transpinnor in the matrix had its four films alternately magnetized, that transpinnor would generate an output.

Figure 9:
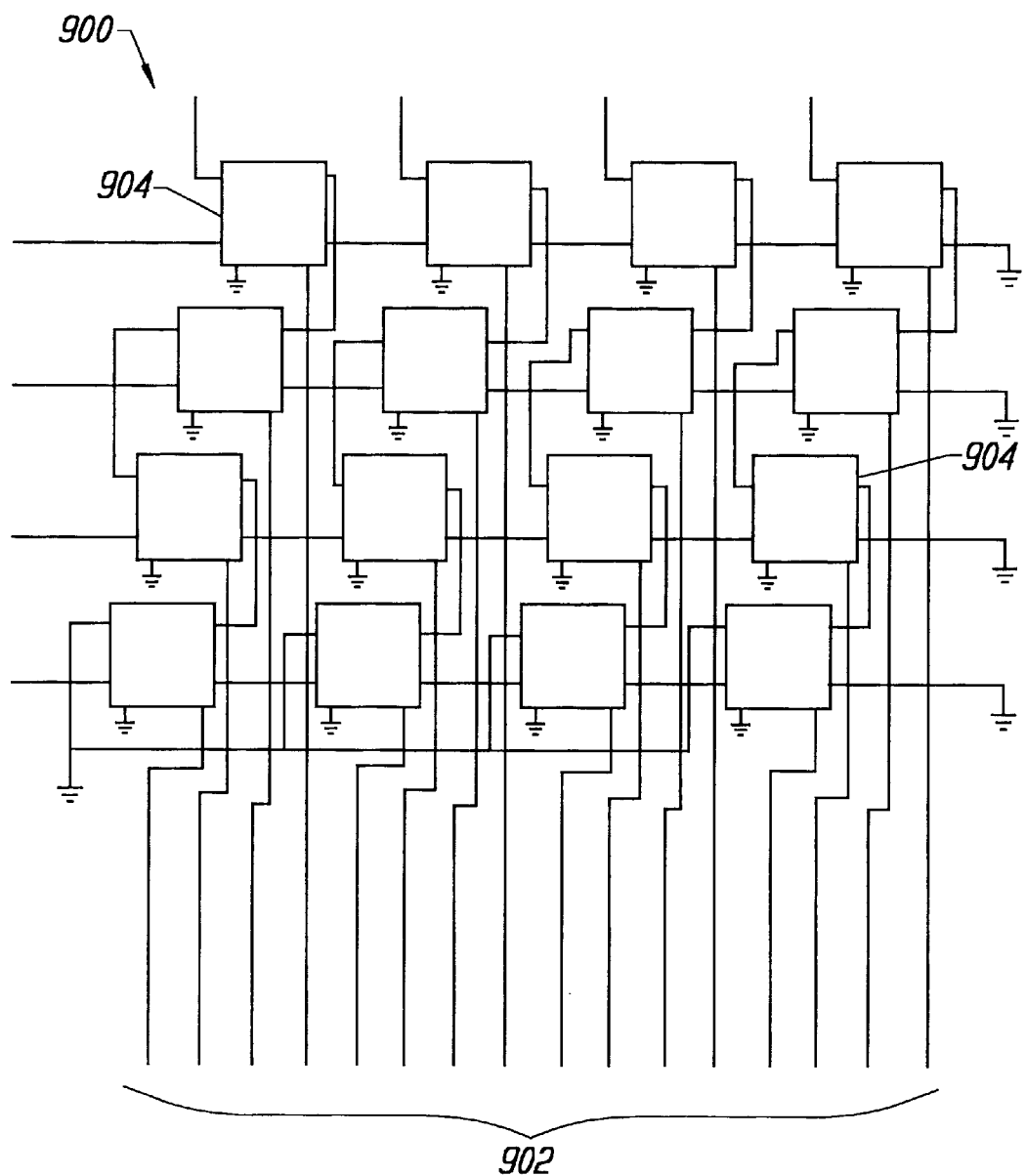
FIG. 9 shows the final stage of a selection matrix for word lines according to a specific embodiment of the invention.

FIG. 9 shows a portion of a selection matrix 900 for word lines 902. According to a specific embodiment, transpinnors 904 are arranged in a 100×100 matrix and can therefore service 10,000 word lines 902. Word lines 902 from each transpinnor 904 drive a corresponding memory cell (not shown). The DC power leads are also not shown. According to this embodiment, similar circuitry is employed to implement a selection matrix for 10,000 digit lines (not shown). Thus, the total number of bits in the memory would be $10^8$ bits, i.e., 100 megabits.

The requirements for a sense-line selection matrix are more stringent than those for the word and digit line selection matrices. For the embodiment described above having 10,000 sense lines, a means of selecting only the signal from the desired line is needed. This requires that inductive and capacitive noise on the selected word line be minimized. To accomplish this, dummy lines and differential amplifiers are employed. The same noise is transmitted on both the sense line and its corresponding dummy line, and is canceled by the differential amplifier. For best results this cancellation should be done in the first amplification stage.

FIG. 10 shows a gated GMR differential amplifier 1000 designed according to one embodiment of the invention for use in a sense-line selection matrix. Once again, four GMR films 1002 are arranged in a Wheatstone bridge configuration. Two input lines 1004 and 1006 supply a switching field to the permalloy layers in GMR films 1002. If the signals on lines 1004 and 1006 are identical, no switching takes place and the output (between nodes 1008 and 1010) is zero. Any common mode noise is thus rejected. Gate lines #1 and #2 facilitate selection of one and only one differential amplifier in the selection matrix. All four lines (gate lines #1 and #2 and input lines 1004 and 1006) are electrically isolated, i.e., there is no electrical connection between them or to GMR films 1002 in gated differential amplifier 1000.

According to another embodiment, the read current is gated by a read-current selection matrix (similar to the word and digit selection matrices above). In this embodiment, the two gate lines are not required because signals come only from the selected sense line and dummy line. However, the gate lines may be used to reset the permalloy after a read operation and, in the case of low film output, to bias the permalloy to the point of maximum sensitivity.

Figure 11:
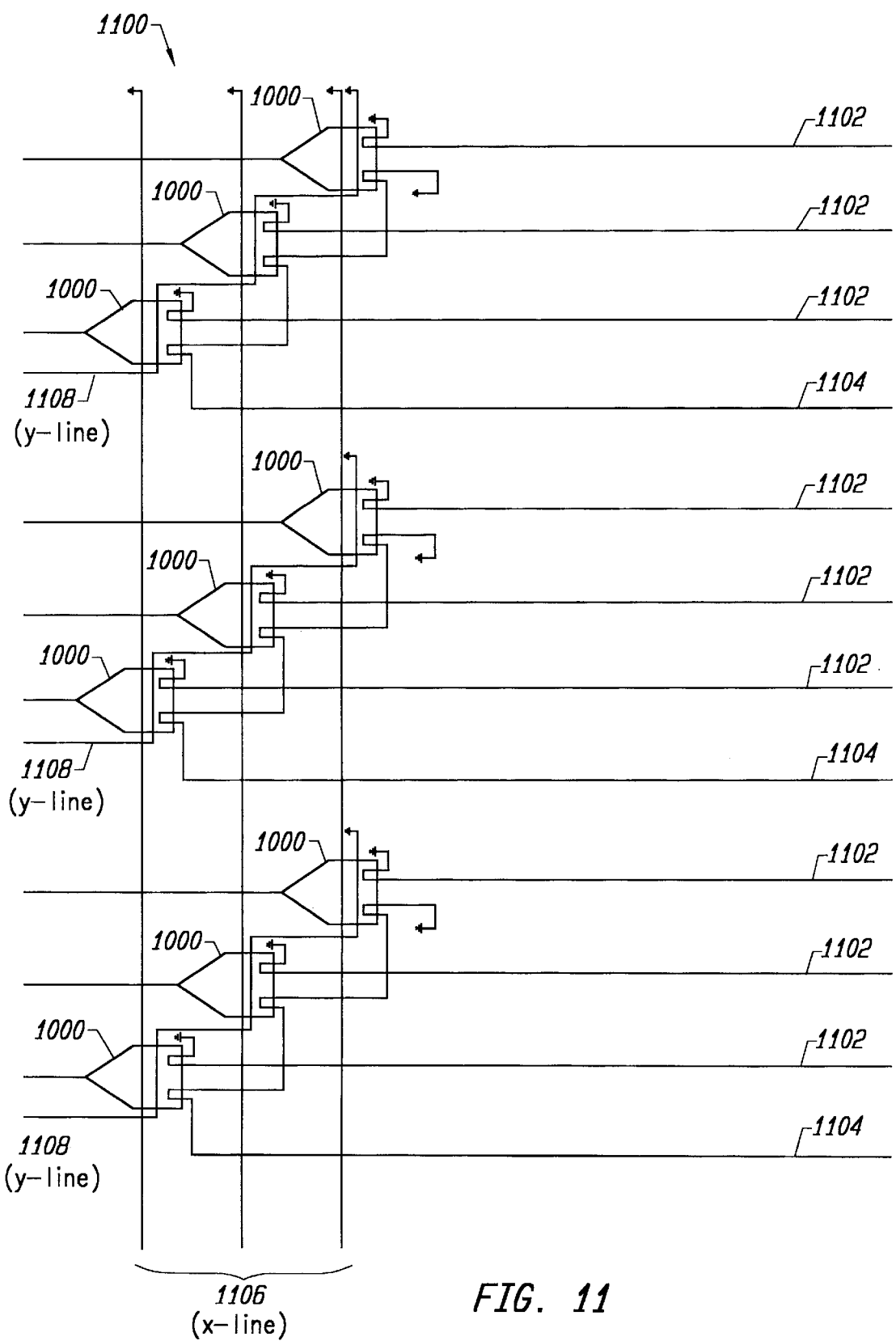
FIG. 11 shows a sense-selection matrix for a GMR PRAM which employs the gated differential amplifier of FIG. 10.

FIG. 11 shows a portion of a sense-line selection matrix 1100 for a GMR PRAM which employs the gated differential amplifier 1000 of FIG. 10. One such differential amplifier is at the end of each sense line 1102. Nine sense lines 1102 are shown in FIG. 11. While one could have a dummy line for each sense line, it is not necessary and is wasteful of space on the substrate. Therefore, in the embodiment shown, each dummy line 1104 is shared by three sense lines 1102 as an input to the respective differential amplifier 1000. It will be understood that the three to one ratio of sense lines to dummy lines shown in FIG. 11 is merely illustrative and that higher ratios may be desirable in commercial products. In an alternative design, active sense lines may also serve as dummy lines when they are not being interrogated. Gate lines #1 and #2 for each differential amplifier 1000 are shown connected to the x lines 1106 and the y lines 1108 of sense-line selection matrix 1100.

The active GMR transpinnor of the present invention is a new kind of device having the main characteristics of a conventional transformer, including: (I) no electrically conductive path between primary and secondary; (ii) signal transmission from the primary to the secondary via a magnetic field; (iii) single-ended (unbalanced) and balanced configurations, each with either inverting or noninverting polarity; and (iv) the output can be gated. The following additional properties of the GMR transformer described herein have no counterparts in a conventional transformer: (v) flat frequency response down to dc; (vi) current, voltage and/or power gain; (vii) any integral or nonintegral (i.e., continuous) ratios of voltage or current between the primary and secondary, as determined by the parameters of the active device.

Figure 12:
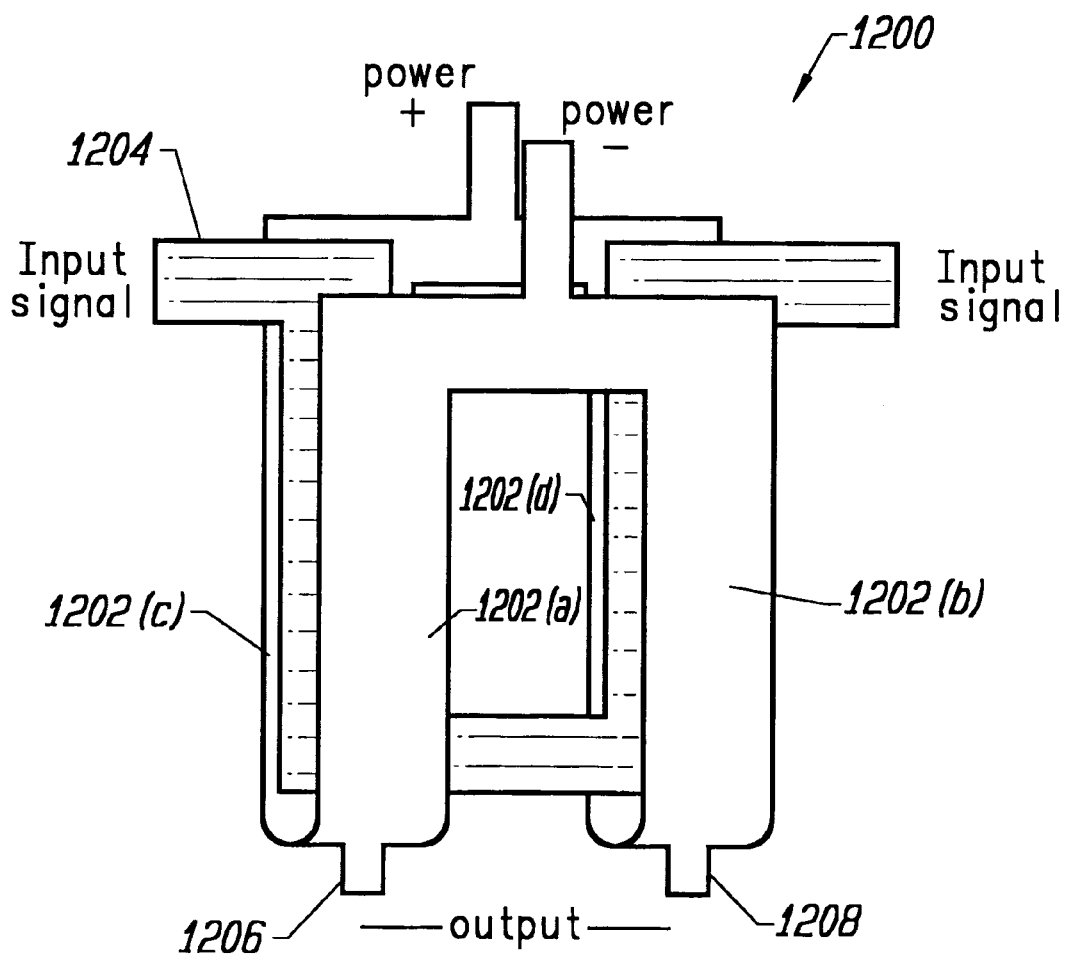
FIG. 12 shows a specific embodiment of a GMR transformer according to the present invention.

One embodiment of an active GMR transformer 1200 consists of four GMR films 1202(a)–(d) arranged in a Wheatstone bridge configuration as shown in FIG. 12. The Wheatstone bridge is folded in order to cancel the demagnetizing field and to use nonmagnetic input line 1204 more efficiently.

At the time of manufacture, transpinnor 1200 is saturated with a large external magnetic field to the left (with respect to FIG. 12). A current from left to right in u-shaped center conductor 1204 causes the permalloy (i.e., low coercivity) layer in the GMR film 1202(a) to be magnetized opposite to that of that film's cobalt layer, and likewise for GMR film 1202(d), thus increasing the resistance in those two legs of the bridge. This causes an imbalance in the bridge, resulting in an output voltage between nodes 1206 and 1208. Reversing the current in the unshaped conductor 1204 causes the bridge to be unbalanced in the other direction, thereby reversing the sign of the output.

It will be understood that GMR transpinnor 1200 can step up (and step down) the voltage in a manner similar to a conventional transformer. However, unlike a conventional transformer, the GMR transpinnor is an active device which can actually have power gain.

Figure 13:
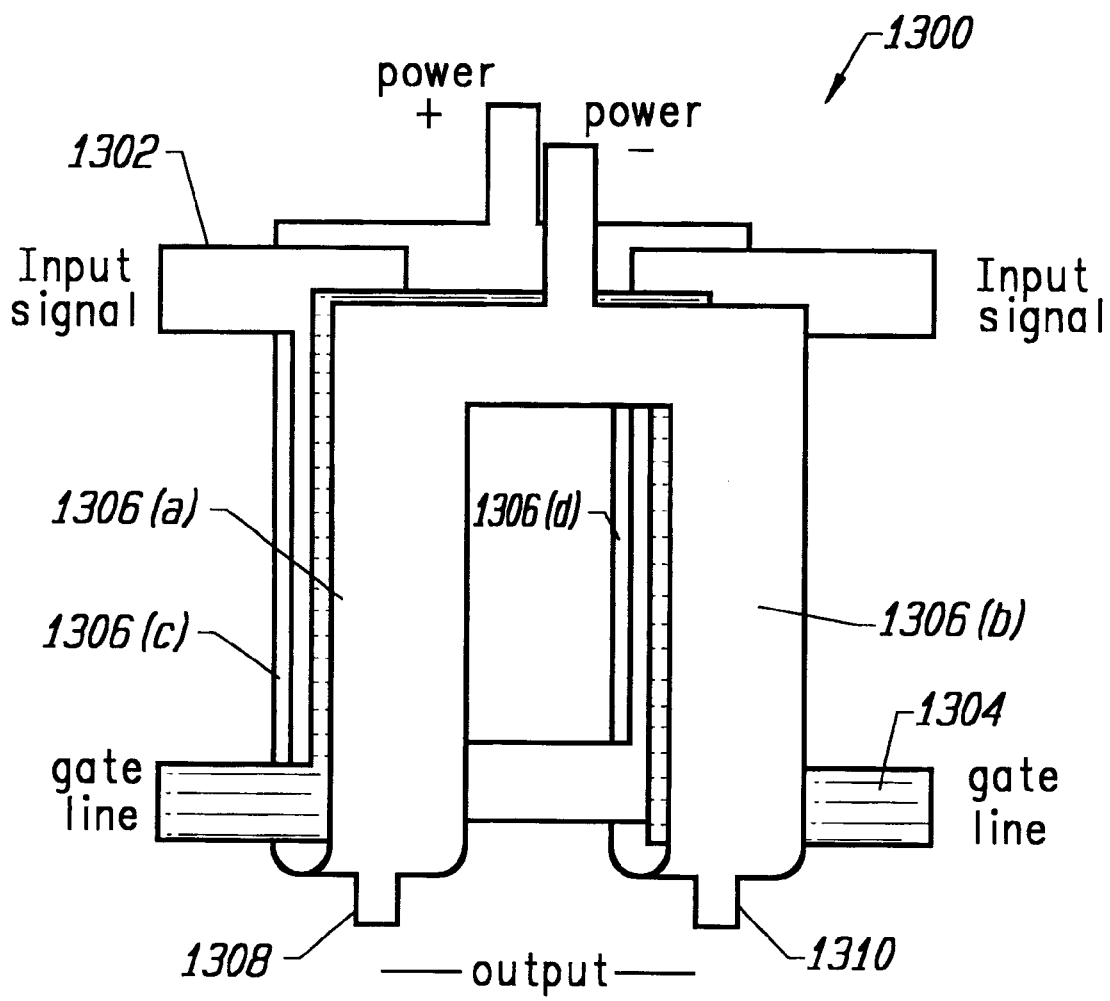
FIG. 13 shows another specific embodiment of a GMR transformer according to the present invention.

There are many applications for transformers, some of which require that the transformers be gated. For example, many of the early military thin-film memories used gated transformers as word and digit gates for selection matrices. An embodiment of a gated GMR transpinnor 1300 is shown in FIG. 13. Conventional gated transformers differ from GMR transpinnor 1300 in that the latter has flat frequency response down to dc and can have gain in voltage, current and power.

Instead of a single nonmagnetic conductor for the introduction of an input signal (as described with respect to transpinnor 1200), transpinnor 1300 has two such nonmagnetic conductors 1302 and 1304. Conductor 1304 serves as the gate line and is used to saturate the permalloy components of the GMR films (1306(a)–(d)) so that no signal is transmitted between primary conductor 1302 and secondary output nodes 1308 and 1310. Note that gate conductor 1304 is isolated from primary conductor 1302 and can also be used as an input line. Thus, the device can also be used as a linear mixer, generating a linear sum of two signals introduced on conductors 1302 and 1304 without distortion. An example of a typical application of a linear mixer is in a PA system, where various microphone signals are mixed and fed into an amplifier. The GMR transpinnor may also be used as a nonlinear mixer, performing logic functions, and/or creating harmonics and the sum and difference frequencies of two input signals.

Figure 14:
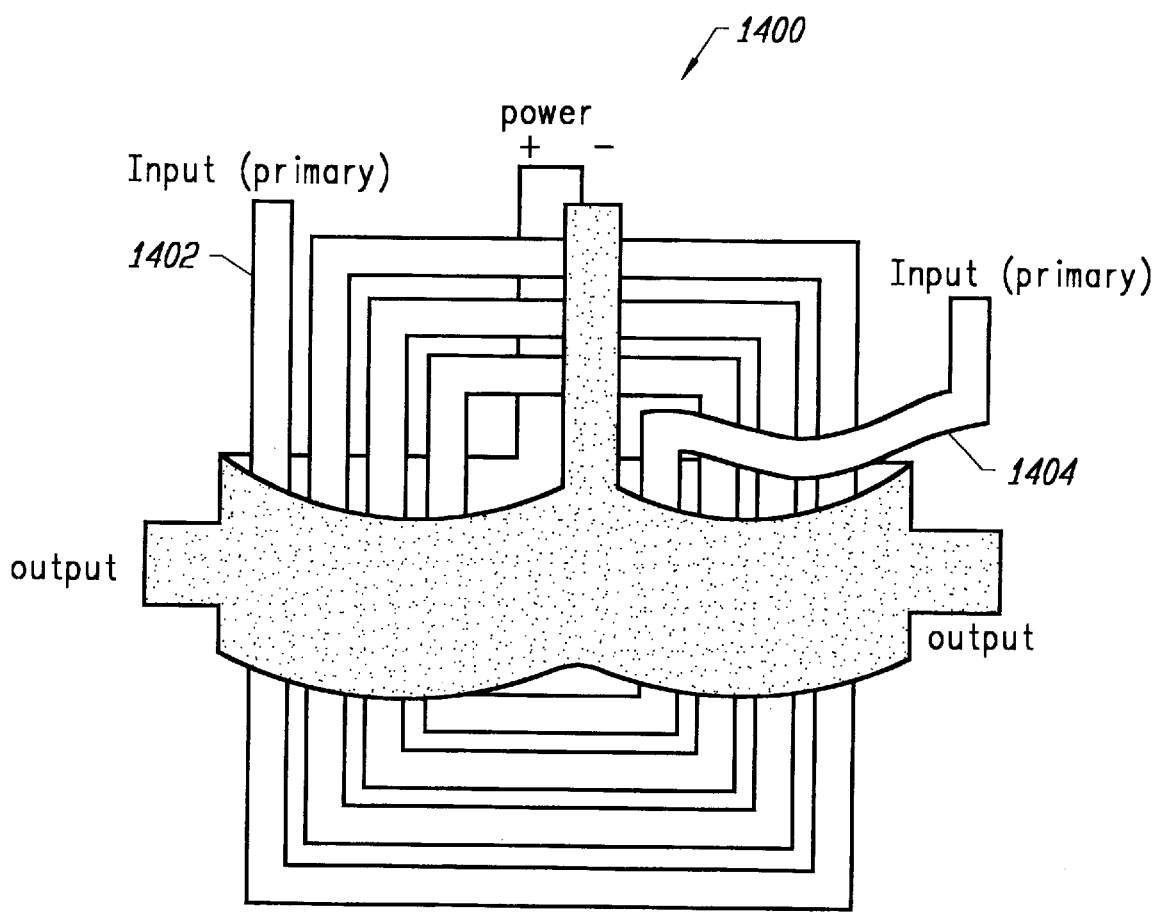
FIG. 14 shows still another specific embodiment of a GMR transformer according to the present invention.

In some cases it may be important to increase the sensitivity of a GMR transformer (defined as the effective primary/secondary transformation ratio) through the use of a multi-turn input line as shown in FIG. 14. Whereas in a conventional transformer voltage step-up is obtained by increasing the ratio of secondary-to-primary turns, in a GMR transformer designed according to the present invention, the effective voltage step-up is achieved by increasing the number of turns in the primary. The secondary remains in the form of a Wheatstone bridge. FIG. 14 shows a GMR transpinnor 1400 which has such a multi-turn input conductor 1402 replacing the single-turn conductor 410 of FIG. 4.

According to this embodiment, input conductor 1402 has four turns, thereby making transformer 1400 four times more sensitive than a similar design with only one turn (i.e., transformer 1600). Shown also is an additional conductor 1404 which is necessary to bring the inside lead of the input coil to the outside of the device. It turns out that this fabrication layer is necessary even in single-turn, ungated designs in order to make the pads thick enough for wire bonding. In actual practice, this thick layer may be deposited over various segments of conductors in order to lower the resistance of those segments. Of course, this is feasible only for segments not required to be thin for the proper operation of the GMR transformer. It will be understood that the multi-turn design requires more area on the chip than the single-turn design.

Applications

The GMR transpinnor of the present invention is a very powerful and versatile tool with attractive properties for a variety of applications. Because there are no inductors or transformers, either passive or active, in conventional semiconductor technology, the realization of such devices using GMR technology enables previously unavailable capabilities. The following are examples of some specific applications for micron and submicron-scale circuit components.

A linear region of operation enables use of the transpinnor for sensor, amplifier and differential-amplifier applications, as well as other analog functions. A variety of logic circuits using active pulse transformers can be developed for wide and diverse applications, including computer functions such as a selection matrix for word or digit lines, logic trees, adders, ALUs and CPUs, i.e., a radiation-hard all-metal microprocessor. Combined with the GMR memory and the analog circuitry, this would open the door to an all-metal computer.

As discussed above with reference to U.S. Pat. No. 5,587,943, a GMR-based memory may be constructed which can perform as reliably as the old magnetic core memories and eliminate the problems associated with therewith in that such a memory has nondestructive read, is easy to fabricate, and has an output which does not shrink as the feature size decreases. This GMR memory also has a decisive advantage over the dominant semiconductor memory, DRAM, in that it is nonvolatile, i.e., data are retained after power is removed from the device. The fabrication methods used for such memories are similar to those used in IC manufacture. Therefore, the GMR transpinnor of the present invention, being based on the same underlying technology as this GMR memory (i.e., multilayer magnetic thin films), provides the ideal foundation for the support circuitry for such a memory in that it can be laid down simultaneously by the same process as the memory array itself.

In general, the six-terminal devices described herein have many more possible uses than conventional three-terminal Si transistors. The greater number of terminals can be utilized to implement a wider variety of interesting circuit configurations, limited only be the creativity of the designer.

Micromechanical systems in general require micron and submicron-scale electronic systems for their operation, e.g., for control and interface to intelligent systems. Together, these form microelectromechanical systems (MEMS), a rapidly growing discipline. The general GMR circuits described herein can play an integral role in all MEMS applications. Transpinnors and GMR circuits in general are ideally suited to operate MEMS devices. For example, many future MEMS will have large numbers of sensors. GMR circuits can amplify small signals from sensors and process them for digital compatibility for further processing of data.

In addition, GMR electronics should function well under the types of environmental stresses that are often encountered in conjunction with MEMS devices, such as radiation, wide temperature range, and humidity which necessitates hermeticity requirements. Finally, being all metal, GMR devices lend themselves to fabrication techniques which are likely compatible with fabrication of some electromechanical devices of micron dimensions and below.

While the invention has been particularly shown and described with reference to specific embodiments thereof, it will be understood by those skilled in the art that the foregoing and other changes in the form and details may be made therein without departing from the spirit or scope of the invention. The scope of the invention should therefore be determined with reference to the appended claims.

What is claimed is:

1. A logic gate comprising:
   a plurality of solid-state components, each of the solid-state components comprising:
     a network of thin-film elements, at least one thin-film element exhibiting giant magnetoresistance, the network having a plurality of nodes, each node representing a direct electrical connection between two of the thin-film elements, first and second ones of the plurality of nodes comprising power terminals, and third and fourth ones of the plurality of nodes comprising an output; and
     at least one conductor inductively coupled to the at least one thin-film element for applying a first magnetic field thereto.

2. The logic gate of claim 1 wherein the plurality of solid-state components are configured to operate as an AND gate.

3. The logic gate of claim 1 wherein the plurality of solid-state components are configured to operate as a NAND gate.

4. The logic gate of claim 1 wherein the plurality of solid-state components are configured to operate as an OR gate.

5. The logic gate of claim 1 wherein the plurality of solid-state components are configured to operate as a NOR gate.

6. The logic gate of claim 1 wherein the plurality of solid-state components are configured to operate as an XOR gate.

7. The logic gate of claim 1 wherein the plurality of solid-state components are configured to operate as a NOT gate.

8. A memory device, comprising:
   a plurality of memory elements; and
   selection circuitry coupled to the memory elements for communicating therewith, the selection circuitry comprising a plurality of solid-state components, each of the solid-state components comprising:
     a network of thin-film elements, at least one thin-film element exhibiting giant magnetoresistance, the network having a plurality of nodes, each node representing a direct electrical connection between two of the thin-film elements, first and second ones of the plurality of nodes comprising power terminals, and third and fourth ones of the plurality of nodes comprising an output; and
     at least one conductor inductively coupled to the at least one thin-film element for applying a first magnetic field thereto.

9. A method for operating a solid-state component as a logic gate, the solid-state component comprising a network of thin-film elements, at least one thin-film element exhibiting giant magnetoresistance, the network having a plurality of nodes, each node representing a direct electrical connection between two of the thin-film elements, first and second ones of the plurality of nodes comprising power terminals, and third and fourth ones of the plurality of nodes comprising an output, the solid-state component also comprising at least one conductor inductively coupled to the at least one thin-film element for applying a magnetic field thereto, the method comprising the steps of:
   setting a switching threshold for the solid-state component, wherein the output of the solid-state component switches where a total field from the at least one conductor exceeds the switching threshold; and
   applying an input signal to the solid-state component via the at least one conductor.

10. The method of claim 9 wherein the step of setting the switching threshold comprises adjusting the width of at least one of the plurality of conductors.

11. The method of claim 9 wherein the solid-state component comprises a plurality of conductors inductively coupled to the at least one thin-film element for applying magnetic fields thereto, and the step of setting the switching threshold comprises:
   setting the amplitudes of input signals on the conductors such that the solid-state component switches only when the fields from all of the plurality of conductors are simultaneously applied; and
   setting a polarity of the at least one thin-film element thereby causing the solid-state component to operate as an AND gate.

12. The method of claim 9 wherein the solid-state component comprises a plurality of conductors inductively coupled to the at least one thin-film element for applying magnetic fields thereto, and the step of setting the switching threshold comprises the steps of:

setting the amplitudes of input signals on the conductors such that the solid-state component switches only when the fields from all of the plurality of conductors are simultaneously applied; and setting a polarity of the at least one thin-film element thereby causing the solid-state component to operate as a NAND gate.

13. The method of claim 9 wherein the solid-state component comprises a plurality of conductors inductively coupled to the at least one thin-film element for applying magnetic fields thereto, and the at least one thin-film element comprises a high-coercivity layer, the step of setting the switching threshold comprising the steps of:

setting the amplitudes of input signals on the conductors such that the field from any one of the conductors can cause the solid-state component to switch, and such that the coercivity of the high-coercivity layer cannot be exceeded by a sum of the fields from all of the conductors; and setting a polarity of the at least one thin-film element thereby causing the solid-state component to operate as an OR gate.

14. The method of claim 9 wherein the solid-state component comprises a plurality of conductors inductively coupled to the at least one thin-film element for applying magnetic fields thereto, and the at least one thin-film element comprises a high-coercivity layer, the step of setting the switching threshold comprising the steps of:

setting the amplitudes of input signals on the conductors such that the field from any one of the conductors can cause the solid-state component to switch, and such that the coercivity of the high-coercivity layer cannot be exceeded by a sum of the fields from all of the conductors; and setting a polarity of the at least one thin-film element thereby causing the solid-state component to operate as a NOR gate.

15. The method of claim 9 wherein the solid-state component comprises a plurality of conductors inductively coupled to the at least one thin-film element for applying magnetic fields thereto, and the at least one thin-film element comprises a high-coercivity element and a low-coercivity element, the step of setting the switching threshold comprising:

setting the amplitudes of input signals on the conductors such that the field from one of the conductors causes only the low-coercivity element to switch, and the fields from more than one of the conductors causes both the low-coercivity and high-coercivity elements to switch; and setting a polarity of the at least one thin-film element thereby causing the solid-state component to operate as an exclusive-OR gate.

16. The method of claim 9 wherein the step of setting the switching threshold comprises configuring the solid-state component such that the output provides a signal which is an inversion of the input signal on the at least one conductor, thereby causing the solid-state component to operate as a NOT gate.

17. A method for linear operation of a solid-state component, the solid state component comprising a network of thin-film elements, at least one thin-film element exhibiting giant magnetoresistance, the network having a plurality of nodes, each node representing a direct electrical connection between two of the thin-film elements, first and second ones of the plurality of nodes comprising power terminals, and third and fourth ones of the plurality of nodes comprising an output, the solid-state component also comprising a conductor inductively coupled to the at least one thin-film element for applying a magnetic field thereto, the method comprising the step of substantially eliminating hysteresis from the at least one thin-film element exhibiting giant magnetoresistance.

18. The method of claim 17 wherein the at least one thin-film element comprises a low-coercivity element which is characterized by an easy axis and an anisotropy field, the eliminating step comprising applying a bias field perpendicular to the easy axis having a magnitude larger than the anisotropy field.

19. The method of claim 18 wherein the bias field is applied with a magnetic device external to the solid-state component.

20. The method of claim 18 wherein the bias field is applied with individually deposited magnets on the solid-state component.

21. The method of claim 18 wherein the bias field is applied by current in a stripline deposited on the solid-state component.

22. The method of claim 17 wherein the at least one thin-film element comprises a cobalt layer characterized by an easy axis and a permalloy layer characterized by a hard axis, the eliminating step comprising the steps of:

depositing the cobalt layer such that the easy axis of the cobalt layer is parallel to the hard axis of the permalloy layer; and driving and sensing the permalloy layer along the hard axis of the permalloy layer.

23. The method of claim 22 wherein the depositing step comprises saturating the cobalt layer during the depositing step in a direction perpendicular to the easy axis of the permalloy layer.

24. The method of claim 17 wherein the at least one thin-film element comprises a plurality of permalloy layers, the eliminating step comprising:

applying an input signal to the conductor, the input signal comprising a stream of data samples; and applying a pulse on the conductor following each data sample having sufficient amplitude to saturate the permalloy layers to an initial state.

\* \* \* \* \*